(12) United States Patent
Shen et al.

(10) Patent No.: US 9,976,898 B2
(45) Date of Patent: May 22, 2018

(54) OPTICAL SENSING MODULE WITH MULTI-DIRECTIONAL OPTICAL SENSING FUNCTION

(71) Applicant: PixArt Imaging Inc., Hsin-Chu (TW)

(72) Inventors: Chi-Chih Shen, Hsin-Chu (TW);
Jen-Yu Chen, Hsin-Chu (TW);
Yen-Hsin Chen, Hsin-Chu (TW);
Kuo-Hsiung Li, Hsin-Chu (TW);
Jui-Cheng Chuang, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 24 days.

(21) Appl. No.: 15/218,078

(22) Filed: Jul. 24, 2016

(65) Prior Publication Data

US 2017/0167914 A1 Jun. 15, 2017

(30) Foreign Application Priority Data

Dec. 9, 2015 (TW) .............................. 104141224 A
Jun. 4, 2016 (TW) .............................. 105117736 A

(51) Int. Cl.
| | | |
|---|---|---|
| *H01J 40/14* | (2006.01) | |
| *G01J 1/44* | (2006.01) | |
| *H05K 1/18* | (2006.01) | |
| *G01J 1/04* | (2006.01) | |

(52) U.S. Cl.
CPC ............. *G01J 1/44* (2013.01); *G01J 1/0403* (2013.01); *H05K 1/181* (2013.01); *H05K 2201/10121* (2013.01); *H05K 2201/10151* (2013.01)

(58) Field of Classification Search
CPC ............ G01J 1/0271; G01J 2001/0276; H05K 2201/10121; H05K 2201/10151
USPC .......................... 250/239; 257/678, 698, 731
See application file for complete search history.

(56) References Cited

U.S. PATENT DOCUMENTS

2012/0001054 A1* 1/2012 Wang ................. H01L 27/14618
250/208.1
2017/0115159 A1* 4/2017 Shen ........................ G01J 1/0214

* cited by examiner

*Primary Examiner* — Kevin Pyo
(74) *Attorney, Agent, or Firm* — Winston Hsu

(57) ABSTRACT

An optical sensing module capable of providing a multi-directional optical sensing function teaches that the optical sensing module can be fixed on a circuit board via a bridging medium. The optical sensing module includes a supporter, a photosensitive component and a connecting component. The supporter includes a base and several lateral portions. The lateral portions are bent from edges of the base to form an accommodating space. The photosensitive component is disposed inside the accommodating space to receive an optical signal passing into an opening of the accommodating space. The connecting component is disposed on the supporter and includes a conductive terminal. The supporter is connected with the bridging material via the conductive terminal to stand on the circuit board by one of a plurality of sensing directions.

21 Claims, 14 Drawing Sheets

OPTICAL SENSING MODULE WITH MULTI-DIRECTIONAL OPTICAL SENSING FUNCTION

BACKGROUND OF THE INVENTION

1. Field of the Invention

The present invention relates to an optical sensing module, and more particularly, to an optical sensing module with the multi-directional optical sensing function.

2. Description of the Prior Art

Please refer to FIG. 14. FIG. 14 is a sectional view of a detecting module 50 in the prior art. The detecting module 50 includes a supporter 52, a detecting component 54 and a pin 56. The detecting component 54 is disposed inside an accommodating space of the supporter 52. The pin 56 protrudes from a bottom surface of the supporter 52 and is electrically connected to the detecting component 54. For assembling the detecting module 50 with a circuit board (not shown in figures), the bottom of the detecting module 50 is disposed on the circuit board, and the pin 56 inserts into a corresponding socket on the circuit board to establish signal transmission channel between the detecting component 54 and the circuit board. A detection direction of the detecting component 54 is parallel to a planar normal vector of the circuit board while the detecting module 50 is disposed on the circuit board; therefore, the detection direction of the conventional detecting module 50 is constrained to orient towards top of the circuit board, and cannot varied according to user's demand.

SUMMARY OF THE INVENTION

The present invention provides an optical sensing module with the multi-directional optical sensing function for solving above drawbacks.

According to the claimed invention, an optical sensing module with a multi-directional optical sensing function capable of being fixed to a circuit board via a bridging medium is disclosed. The optical sensing module includes a supporter, a photosensitive component and a connecting component. The supporter includes a base and several lateral portions. The lateral portions are bent from edges of the base to form an accommodating space. The photosensitive component is disposed inside the accommodating space to receive an optical signal passing into an opening of the accommodating space. The connecting component is disposed on the supporter and includes a conductive terminal. The supporter is connected with the bridging material via the conductive terminal to stand on the circuit board by one of a plurality of sensing directions.

According to the claimed invention, the connecting component optionally includes at least one hole structure formed on at least one corresponding lateral portion of the plurality of lateral portions, and the conductive unit is disposed inside the hole structure. Moreover, the connecting component may optionally include a stretching portion connected to a lateral side of the bottom portion, and the conductive unit is disposed on a surface of the stretching portion. The supporter stands on the circuit board by the corresponding lateral portion, and the opening faces toward a direction different from a planar normal vector of the circuit board.

One of the embodiments in the present invention forms the hole structure on the lateral portion of the supporter, and the conductive unit is disposed inside the hole structure to connect with the circuit board via the bridging medium; wherein an active circuit or a passive circuit is optionally disposed inside the circuit board in accordance with design demand of the optical sensing module. An amount of the hole structure can be one or more, a variety of the hole structure can be, but not limited to, the half-hole structure or the quarter-hole structure, and position of the foresaid hole structures is not limited the above-mentioned embodiments in the present invention. The foresaid lateral portion can only be the lateral surface of the base, or be the lateral surface of the sheltering component, or be the whole or partial lateral surfaces of the base and the sheltering component. The hole structure may be formed on the all lateral portions of the supporter, or optionally formed on the part of the lateral portions of the supporter.

The other embodiment in the present invention disposes the stretching portion by the supporter, the stretching portion has the conductive unit, and the conductive unit can be connected with the circuit board via the bridging medium; in this embodiment, the active circuit or the passive circuit can be optionally disposed inside the circuit board. While the supporter utilizes the hole structure or the stretching portion of the connecting component to stand upon the circuit board, the supporter fixed onto the circuit board can face any sensing direction, which means signal transmission direction of the optical sensing module can be varied according to user's demand. Comparing to the prior art, the present invention disposes the connecting component having the hole structure or the stretching portion by the supporter, the supporter can be disposed on the circuit board alternatively by the bottom portion and the lateral portion, and the optical sensing module can provide the multi-directional optical sensing function.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
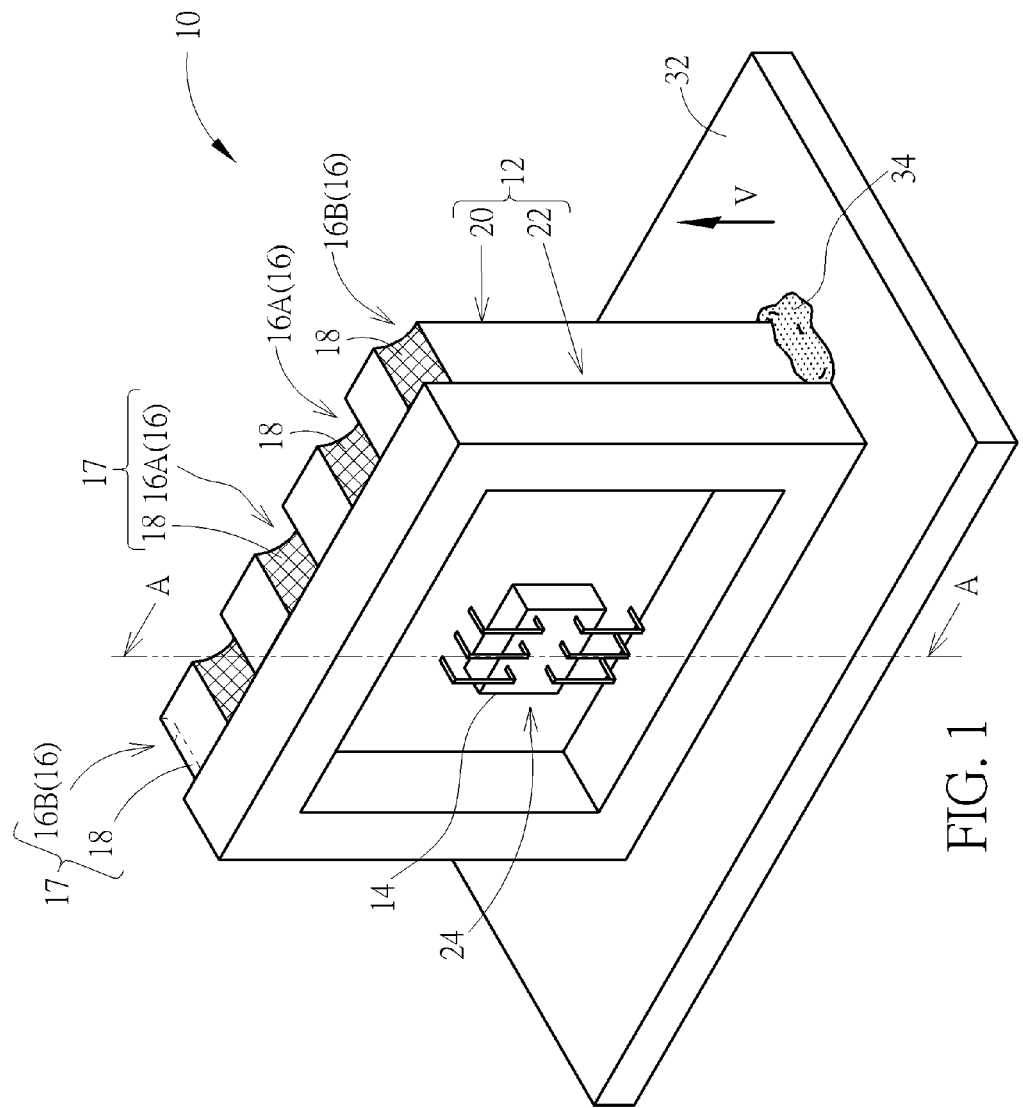
FIG. 1 is a diagram of an optical sensing module with a multi-directional optical sensing function according to the first embodiment of the present invention.
Figure 2:
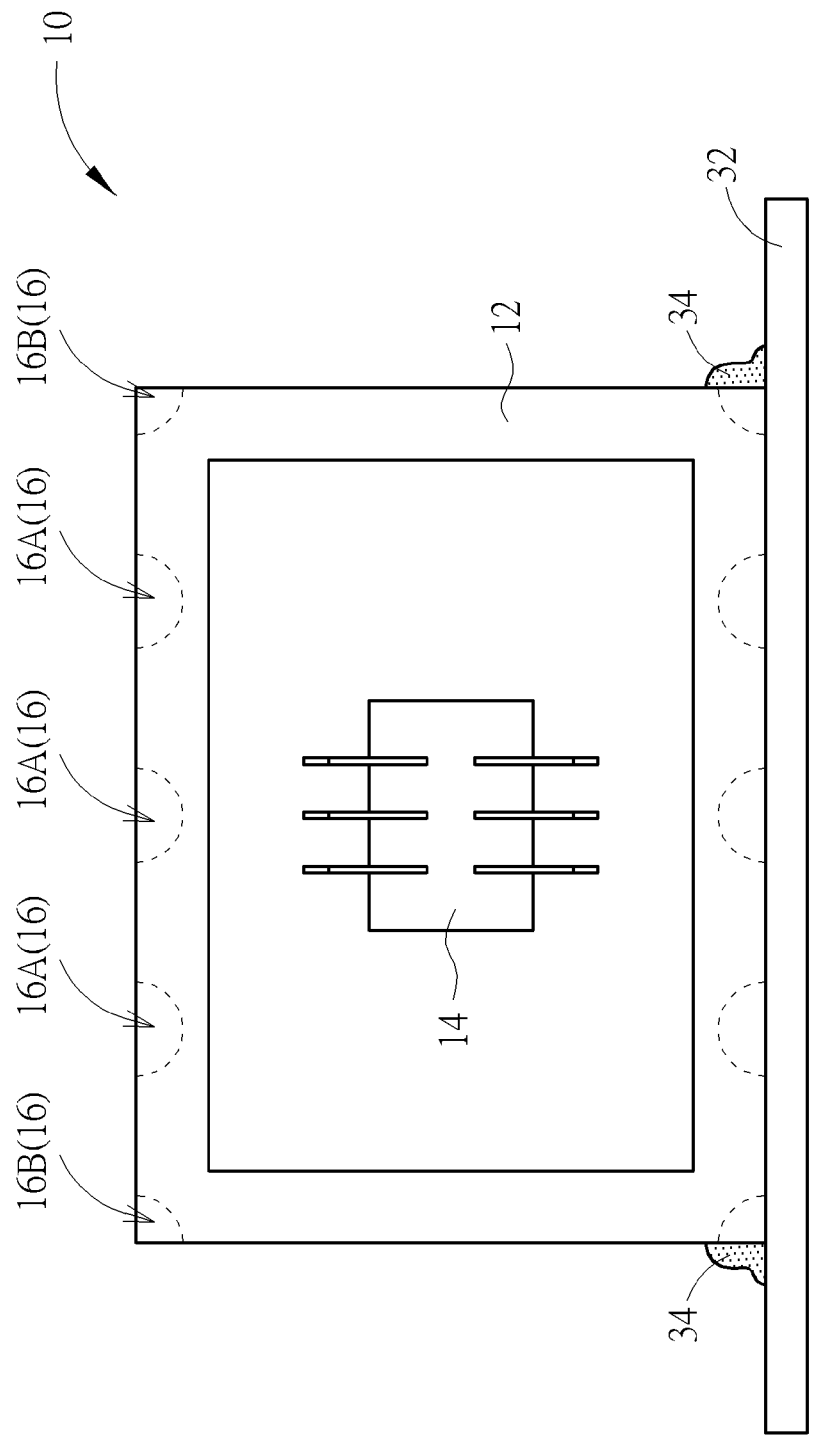
FIG. 2 is a top view of the optical sensing module according to the first embodiment of the present invention.
Figure 3:
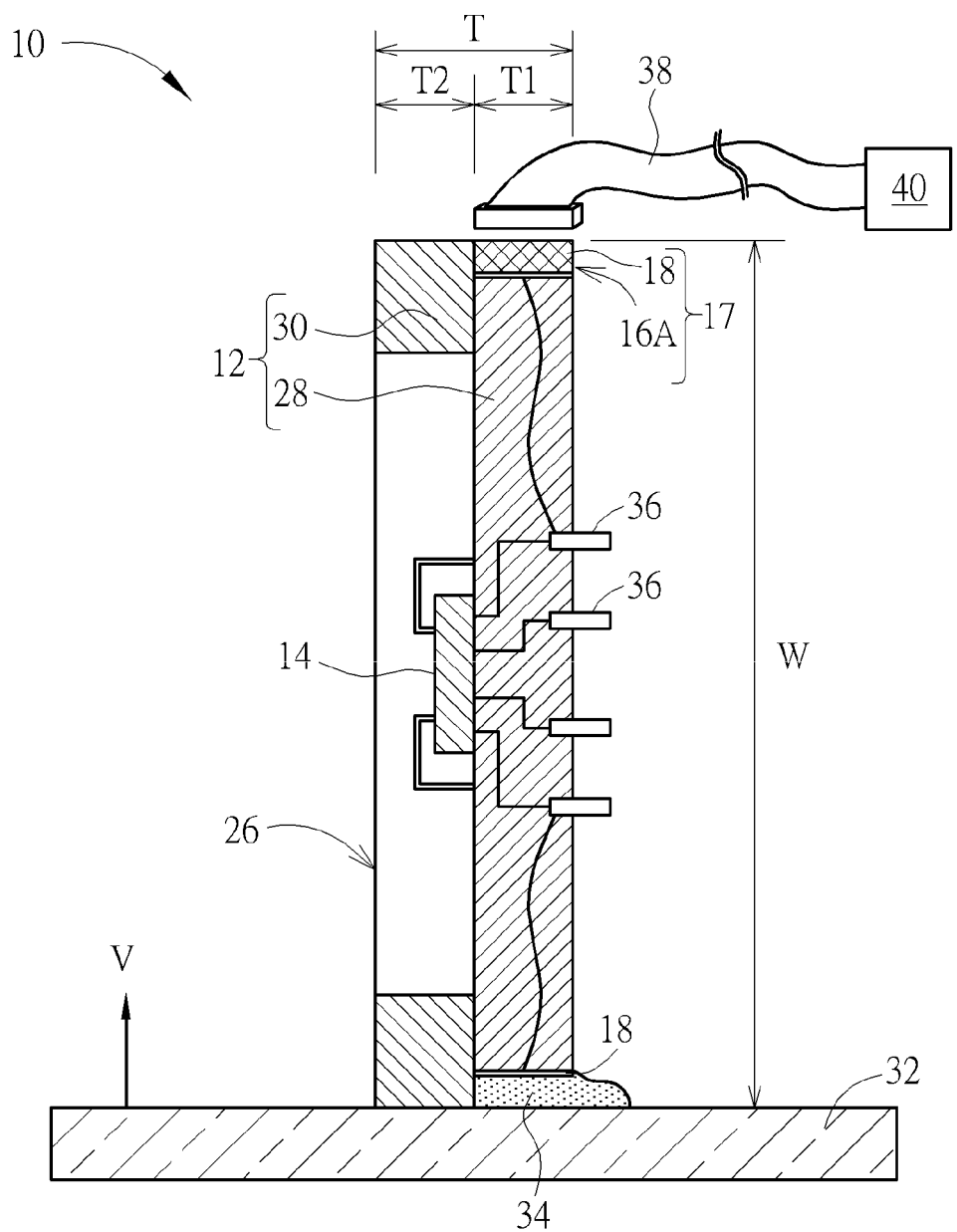
FIG. 3 is a sectional view of the optical sensing module shown in FIG. 1.

Please refer to FIG. 1 to FIG. 3. FIG. 1 is a diagram of an optical sensing module 10 with a multi-directional optical sensing function according to a first embodiment of the present invention. FIG. 2 is a top view of the optical sensing module 10 according to the first embodiment of the present invention. FIG. 3 is a sectional view of the optical sensing module 10 shown in FIG. 1 along line A-A. The optical sensing module 10 includes a supporter 12, a photosensitive component 14 and a connecting component 17. The supporter 12 includes a bottom portion 20 and a plurality of lateral portions 22. The plurality of lateral portions 22 is respectively bent from edges of the bottom portion 20, so as to form an accommodating space 24 where inside the photosensitive component 14 is disposed. Thus, the plurality of lateral portions 22 applies light isolation to the photosensitive component 14, so the photosensitive component 14 receives an optical signal passing into the accommodating space 24 through an opening 26 of the accommodating space 24. An optical emitting component (not shown in figures) is an optional unit, which can be disposed by the photosensitive component 14 inside the accommodating space 24 or be an external unit relative to the optical sensing module 10. Application of the optical emitting component is varied according to design demand, and a detailed description is omitted herein for simplicity.

The supporter 12 is mainly composed of, but not limited to, a base 28 and a sheltering component 30. The photosensitive component 14 is disposed on the base 28. The sheltering component 30 is disposed on the base 28 and surrounds the photosensitive component 14 to form the foresaid accommodating space 24. Generally, the bottom portion 20 can be defined as a bottom surface of the base 28, and the lateral portion 22 can be defined according to structural variation of different embodiments. For example, in the first embodiment, the lateral portion 22 is defined as a lateral surface of the base 28. In the present invention, a thickness T1 of the base 28 is preferably ranged between 0.8 times and 1.5 times a thickness T2 of the sheltering component 30 (which means the thickness T1 is larger than 0.8 times the thickness T2), and the thickness T1 is preferably greater than 0.4 mm; a width W of the base 28 is preferably smaller than 8 times a total thickness T of the base 28 and the sheltering component 30.

The connecting component 17 can include a hole structure 16 and a conductive unit 18. The hole structure 16 is formed on at least one lateral portion 22 of the plurality of lateral portions 22 by a mechanical hole drilling technique. The conductive unit 18 is fixed inside the hole structure 16 as a thin film or in an electroplating manner. The conductive unit 18 can be made by conductive metal (such as copper material) or oxidation-proofing metal (such as nickel material) or gold material. The optical sensing module 10 is a modular chip connected with the circuit board 32 via a bridging medium 34, such like solder paste. Therefore, the supporter 12 can be connected with the circuit board 32 via the conductive unit 18 and the bridging medium 34, to stand the supporter 12 upon the circuit board 32 by the specific lateral portion 22 (which has the conductive unit 18 connected with the bridging medium 34). The opening 26 of the supporter 12 can arbitrarily face toward any direction different from a planar normal vector V of the circuit board 32, and the user can choose one of the sensing directions where the optical sensing module faces while being disposed on the circuit board 32.

As shown in FIG. 1 and FIG. 2, the hole structure 16 can be a half-hole structure 16A or a quarter-hole structure 16B. The half-hole structure 16A is mainly located on the non-edged region of the lateral portion 22, and adapted to increase connection strength by more contacting area between the conductive unit 18 and the bridging medium 34. The quarter-hole structure 16B is mainly located on the edged region of the lateral portion 22, and not only adapted to increase the contacting area between the conductive unit 18 and the bridging medium 34 but also to provide preferred connection stability by surface tension of the solder paste (such like the bridging medium 34). It should be mentioned that the embodiment can only dispose the half-hole structure 16A on the lateral portion 22, or only dispose the quarter-hole structure 16B on the lateral portion 22, or simultaneously dispose the half-hole structure 16A and the quarter-hole structure 16B on the lateral portion 22; application of the hole structure 16 is varied according to design demand.

As shown in FIG. 3, the supporter 12 can include a plurality of connecting terminals 36 electrically connected with the photosensitive component 14 and protruding from the bottom portion 20 or the bottom surface of the base 28. While the optical sensing module 10 is disposed on the circuit board 32 (for example, the bottom portion 20 of the supporter 12 contacts against the circuit board 32), the connecting terminal 36 inserts into the circuit board 32 to establish signal transmission channel between the photosensitive component 14 and the circuit board 32. Furthermore, the connecting terminal 36 can be electrically connected with the conductive unit 18 optionally; while the optical sensing module 10 stands on the circuit board 32 by the lateral portion 22, the signal transmission channel between the connecting terminal 36 and the circuit board 32 is established via the conductive unit 18 and the bridging medium 34. The conductive unit 18 further can be electrically connected with the photosensitive component 14 directly, and then connected with an external electronic component 40 via a connecting cable 38. The conductive unit 18 electrically connected with the photosensitive component 14 can be regarded as a testing terminal of the optical sensing module 10, the connecting cable 38 is a flexible flat cable, the external electronic component 40 is a testing equipment, and the testing terminal can be connected with the testing equipment via the flexible flat cable for convenient functional test.

Figure 4:
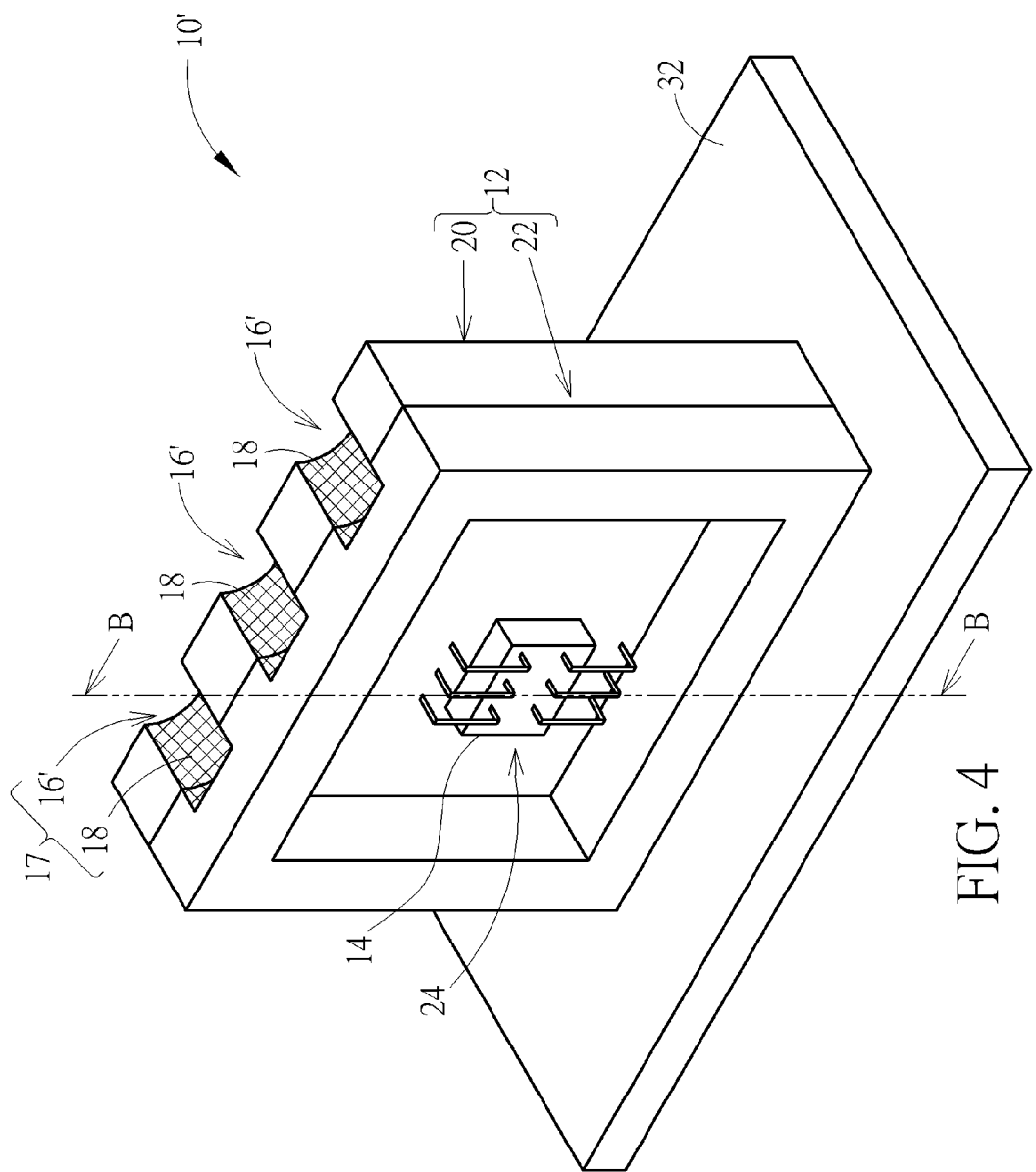
FIG. 4 is a diagram of the optical sensing module according to the second embodiment of the present invention.
Figure 5:
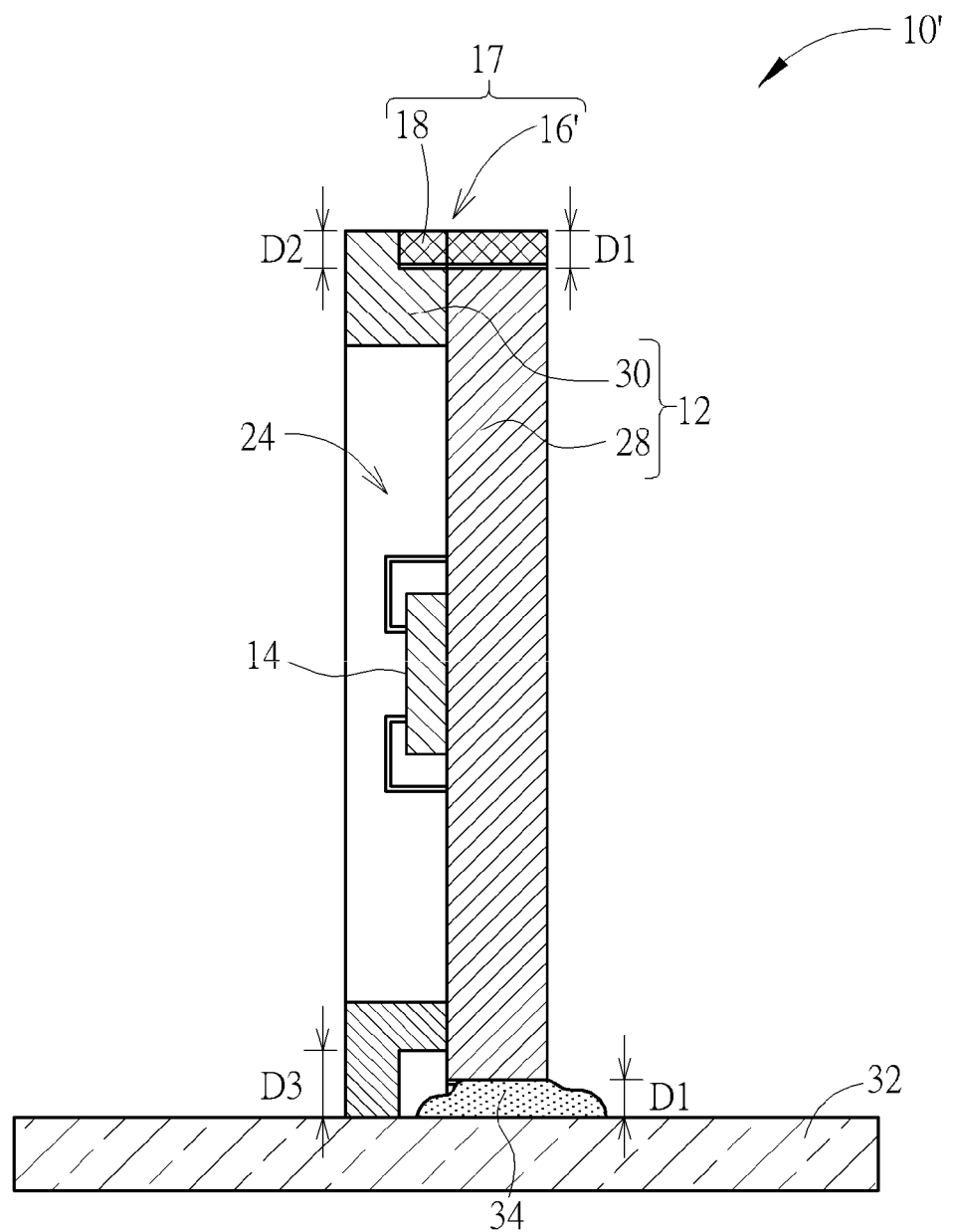
FIG. 5 is a sectional view of the optical sensing module shown in FIG. 4.

Please refer to FIG. 4 and FIG. 5. FIG. 4 is a diagram of the optical sensing module 10' according to a second embodiment of the present invention. FIG. 5 is a sectional view of the optical sensing module 10' shown in FIG. 4 along line B-B. Components of the optical sensing module 10' are similar to ones of the optical sensing module 10. Difference between the first embodiment and the second embodiment is: the hole structure 16' of the optical sensing module 10' is formed on the lateral surface of the base 28 and part of the corresponding lateral surface of the sheltering component 30, which means the lateral portion 22 in the second embodiment is defined as the adjacent lateral surfaces of the base 28 and the sheltering component 30. As shown in FIG. 5, a region of the hole structure 16' within the base 28 has a radial dimension D1, regions of the hole structure 16' within the sheltering component 30 respectively have a radial dimension D2 and a radial dimension D3. Hollow space (having the radial dimensions D2 and D3) of the hole structure 16' formed within the sheltering component 30 can increase the contacting area between the conductive unit 18 and the bridging medium 34 to provide the preferred connection strength and stability, and the radial dimension of the hollow space may be the same as or different from the radial dimension D1 of the hole structure 16' within the base 28. No matter what radial dimension the hole structure 16' within the sheltering component 30 equals (for example, the radial dimension D2 is the same as the radial dimension D1, and the radial dimension D3 is different from the radial dimension D1), any design of utilizing the surface tension of the solder paste (such as the bridging medium 34) to increase the connection strength and stability about the circuit board belongs to a scope of the second embodiment in the present invention.

It should be mentioned that while the hole structure 16' of the second embodiment is formed on the part of the lateral surface of the sheltering component 30, the hole structure 16' is located on a side of the sheltering component 30 adjacent to the base 28 and does not protrude from the other side of the sheltering component 30 opposite to the base 28, as shown in FIG. 5. In the second embodiment, the bridging medium 34 (such as the solder paste) is preferably coated on a region of the hole structure 16' within the base 28. Quantity of the bridging medium 34 may be slightly greater than volume of the hole structure 16', right part of the bridging medium 34 overflows the hole structure 16' onto a right side of the base 28, and the surface tension can be generated accordingly by the overflowing bridging medium 34. Because the hole structure 16' stretches into the sheltering component 30 (such as forming the foresaid hollow space), left part of the bridging medium 34 overflows the hole structure 16' onto a left side of the base 28, and the surface tension can be generated upon opposite sides of the base 28 to increase the connection strength and stability between the supporter 12 and the circuit board.

Figure 6:
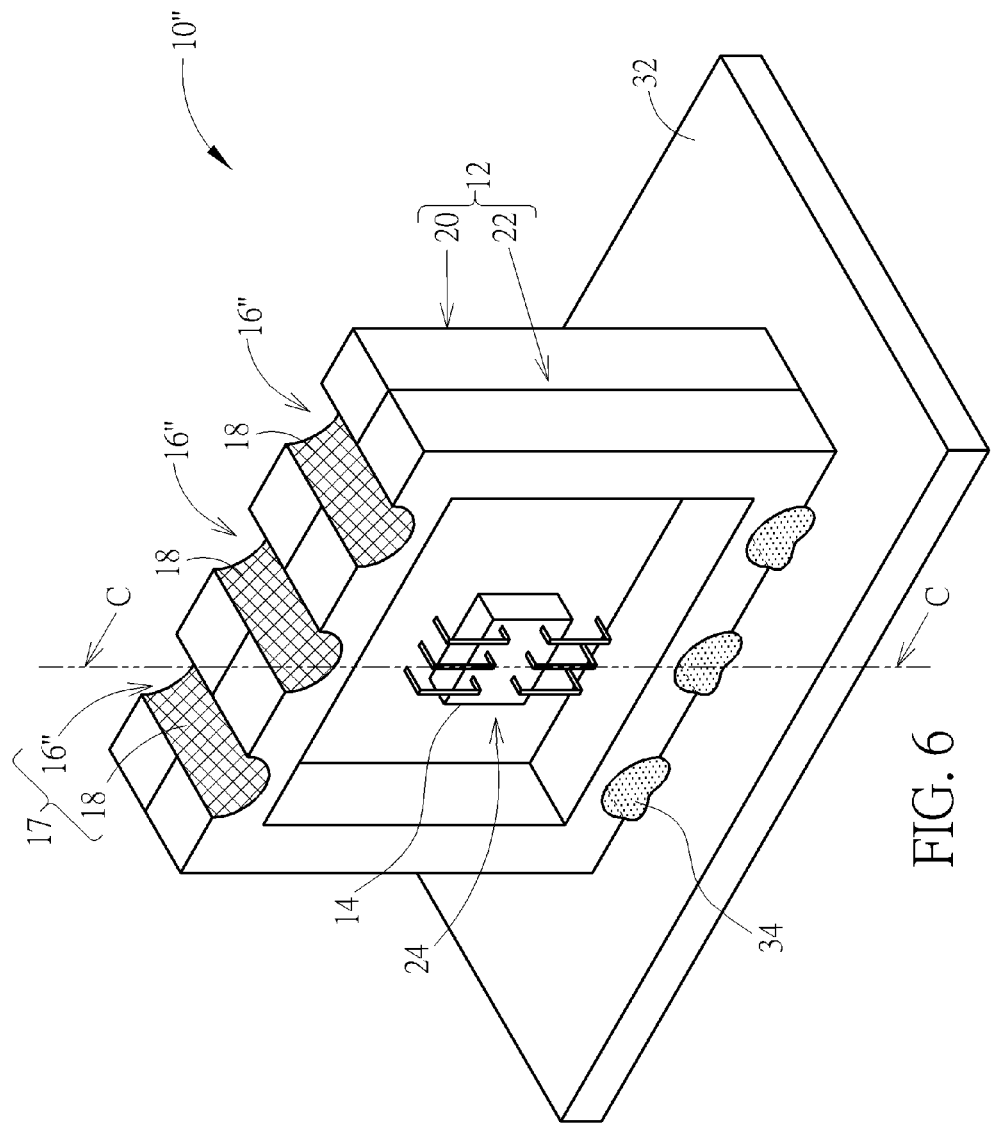
FIG. 6 is a diagram of the optical sensing module according to the third embodiment of the present invention.
Figure 7:
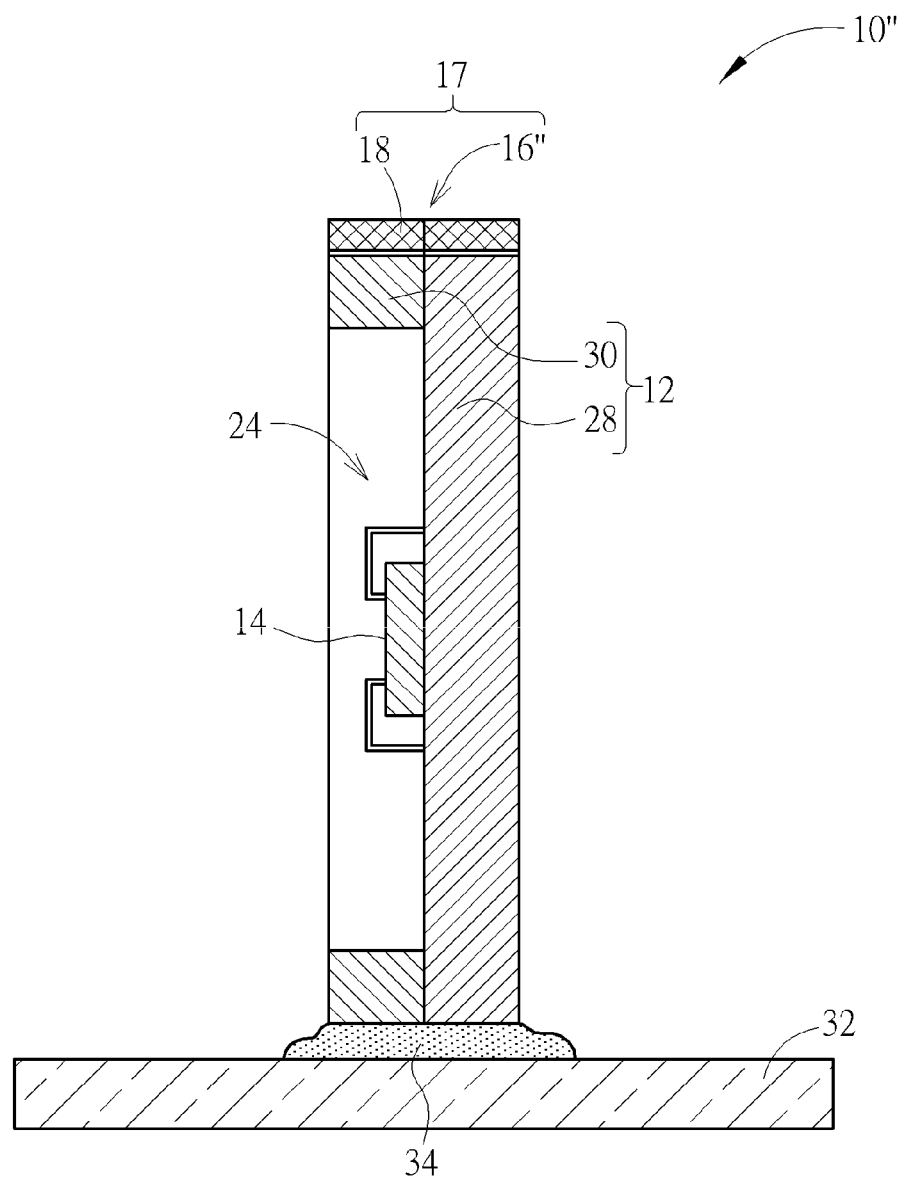
FIG. 7 is a sectional view of the optical sensing module shown in FIG. 6.

Please refer to FIG. 6 and FIG. 7. FIG. 6 is a diagram of the optical sensing module 10" according to a third embodiment of the present invention. FIG. 7 is a sectional view of the optical sensing module 10" shown in FIG. 6 along line C-C. Components of the third embodiment are similar to ones of the above-mentioned embodiments. Difference between the third embodiment and the above-mentioned embodiments is: the hole structure 16" of the optical sensing module 10" is formed on the lateral surface of the base 28 and the whole corresponding lateral surface of the sheltering component 30, which means the lateral portion 22 of the third embodiment is defined as the adjacent lateral surfaces of the base 28 and the sheltering component 30, and the base 28 and the sheltering component 30 are broken through by the hole structure 16" to penetrate two opposite sides of the sheltering component 30. The hole structure 16" of the third embodiment can increase the contacting area between the conductive unit 18 and the bridging medium 34 more, so as to enhance the connection strength and stability of the supporter 12 and the circuit board 32.

Figure 8:
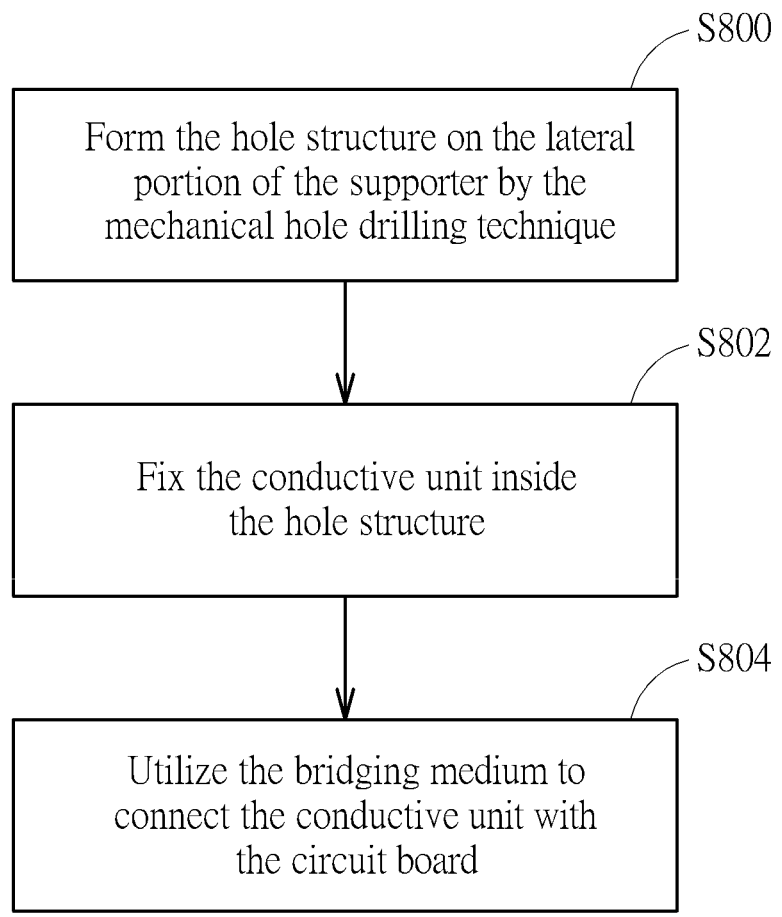
FIG. 8 is a flow chart of manufacturing the optical sensing module with the multi-directional optical sensing function according to the embodiment of the present invention.

Please refer to FIG. 8. FIG. 8 is a flowchart of manufacturing the optical sensing module with the multi-directional optical sensing function according to the embodiment of the present invention. The manufacturing method illustrated in FIG. 8 is suitable for the optical sensing module of the foresaid embodiments. First, step S800 is executed to form the hole structure 16, 16', or 16" on one lateral portion 22 or several lateral portions 22 of the supporter 12 by the mechanical hole drilling technique. As described in the first embodiment, the manufacturing method of the present invention utilizes the mechanical hole drilling technique to form the hole structure 16 on the known cutting line of the motherboard (which represents the uncut circuit board), and then the motherboard is divided along the hole structure 16 (or along the known cutting line) into a plurality of bases 28 with smaller dimensions, so that the hole structure 16 can be formed on the corresponding lateral portion 22 of the base 28. The initial hole structure 16 on the uncut motherboard is generally equal to a circular form, the circular hole structure 16 is processed to form the half-hole structure 16A by one-cutting process, or to form the quarter-hole structure 16B by twice-cutting process, as shown in FIG. 1; the manufacturing method of the half-hole structure 16A further can be applied to the second embodiment and the third embodiment of the present invention.

While the hole structure 16 is formed, step S802 is executed to fix the conductive unit 18 inside the hole structure 16, and step S804 is finally executed to connect the conductive unit 18 with the circuit board 32 via the bridging medium 34. The conductive unit 18 is an interface connected between the supporter 12 and the circuit board 32 though the bridging medium 34 for stable combination. In different embodiments of the present invention, the hole structure 16, 16', or 16" can be formed on the corresponding lateral surface of the base 28 and/or the sheltering component 30. Therefore, the manufacturing method of the optical sensing module can form the hole structure 16, 16', or 16" respectively on the base 28 and the sheltering component 30, then the sheltering component 30 is assembled with the base 28 to connect the hole structure 16, 16', or 16"; the hole structure 16, 16', or 16" formed by the foresaid manufacturing method may exist stage difference, as the below hole structure 16' of the optical sensing module 10' shown in FIG. 5. Another manufacturing method is executed to combine the base 28 with the sheltering component 30 for a start, and then the hole structure 16, 16', or 16" is formed on a combination of the base 28 and the sheltering component 30; the hole structure 16, 16', or 16" formed by the foresaid manufacturing method is flat, such as the above hole structure 16' of the optical sensing module 10' shown in FIG. 5 and the hole structure 16" of the optical sensing module 10" shown in FIG. 6.

Figure 9:
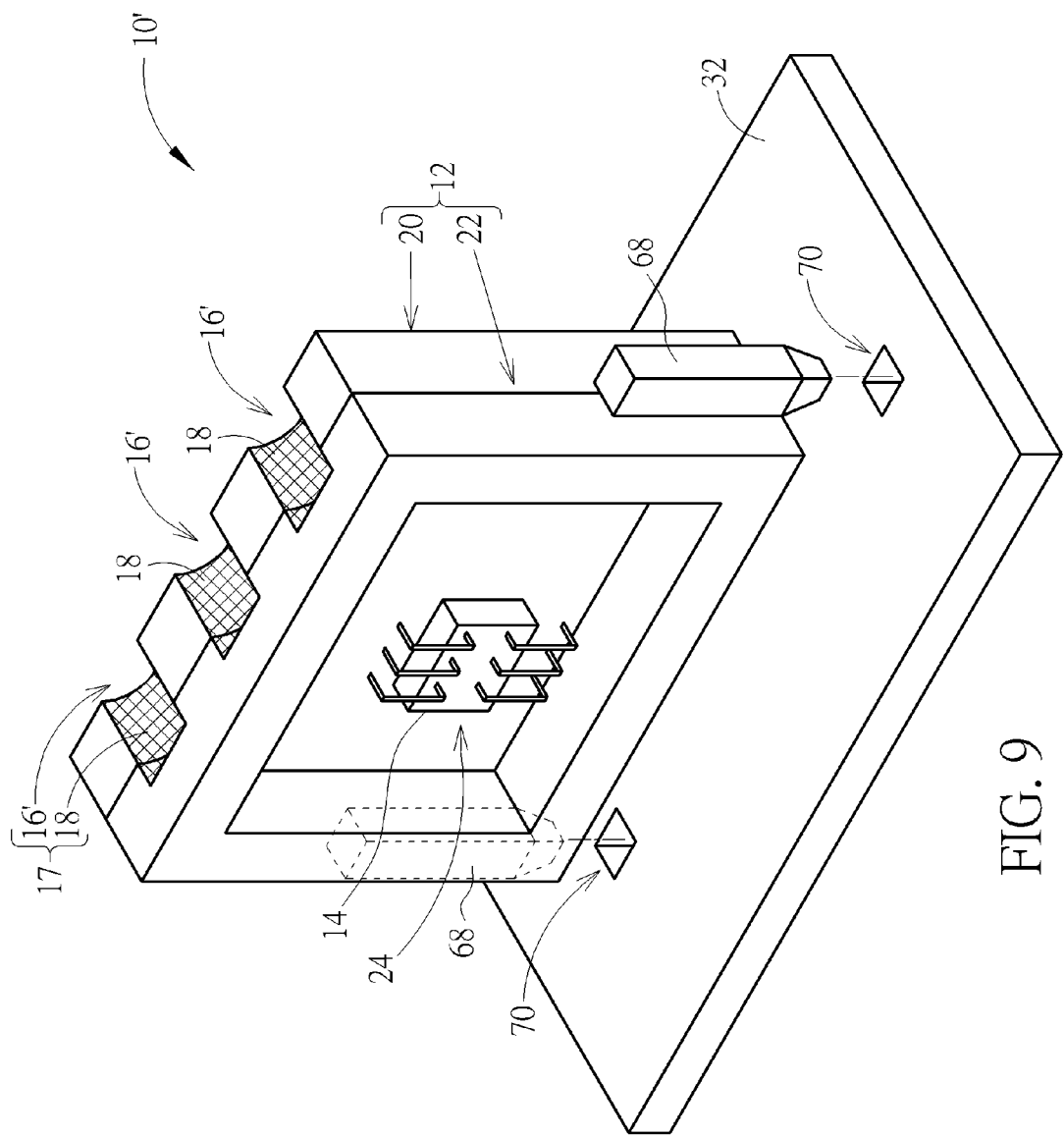
FIG. 9 is a diagram of the optical sensing module according to another possible embodiment of the present invention.

Please refer to FIG. 9. FIG. 9 is a diagram of the optical sensing module according to another possible embodiment of the present invention. The optical sensing module in this embodiment can be applied to any of the optical sensing modules 10, 10', 10". As an example of the optical sensing module 10', one or more positioning components are optionally disposed by sides of the supporter 12. The positioning component 68 can be merely connected to the bottom portion 20, merely connected to the lateral portion 22, or simultaneously connected to the bottom portion 20 and the lateral portion 22. A bottom end (an end facing the circuit board 32) of the positioning component 68 protrudes from an edge of the supporter 12, and a positioning hole structure 70 is formed on the circuit board 32 accordingly. While the supporter 12 is assembled with the circuit board 32, the positioning component 68 partly inserts into the positioning hole structure 70 in a wedged manner or in an adhesive manner. That is, the present invention utilizes an assembly of the positioning component 68 and the positioning hole structure 70 to increase connection strength and stability between the supporter 12 and the circuit board 32, so as to avoid the supporter 12 from being inclined or deviated due to non-uniform tension generated by the melted bridging medium 34.

Figure 10:
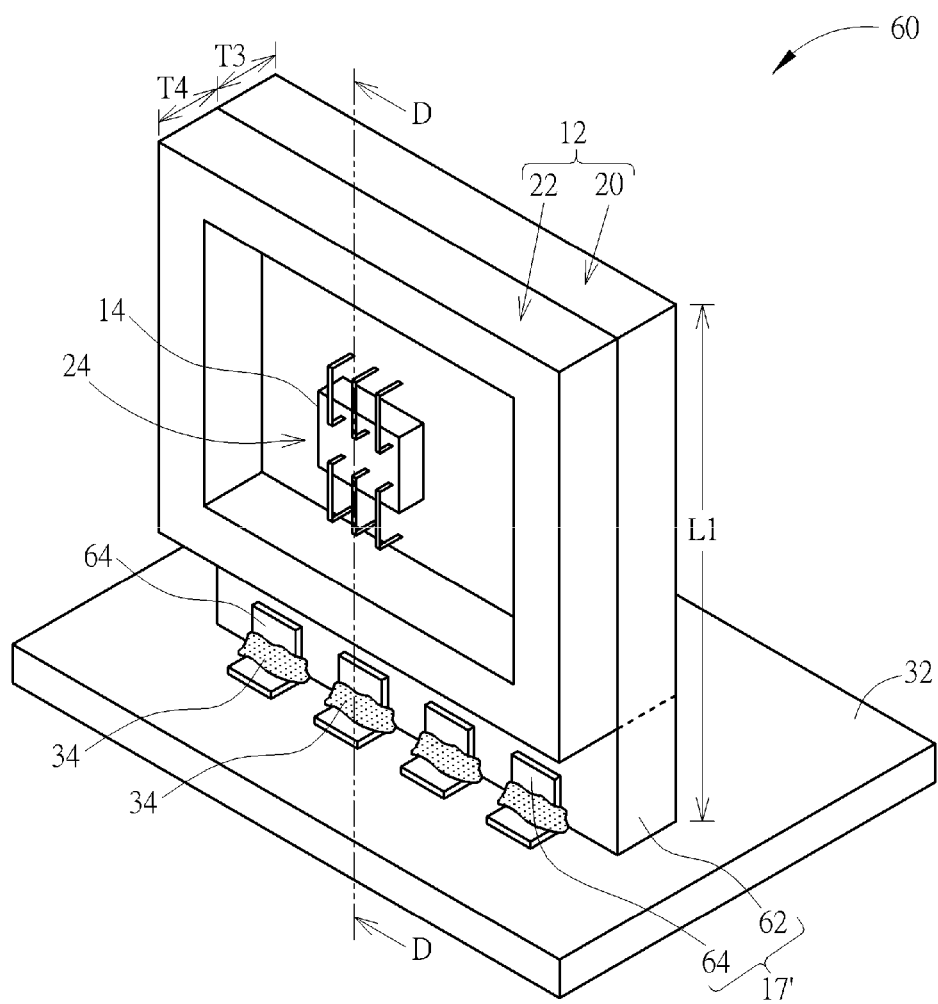
FIG. 10 is a diagram of the optical sensing module according to the fourth embodiment of the present invention.
Figure 11:
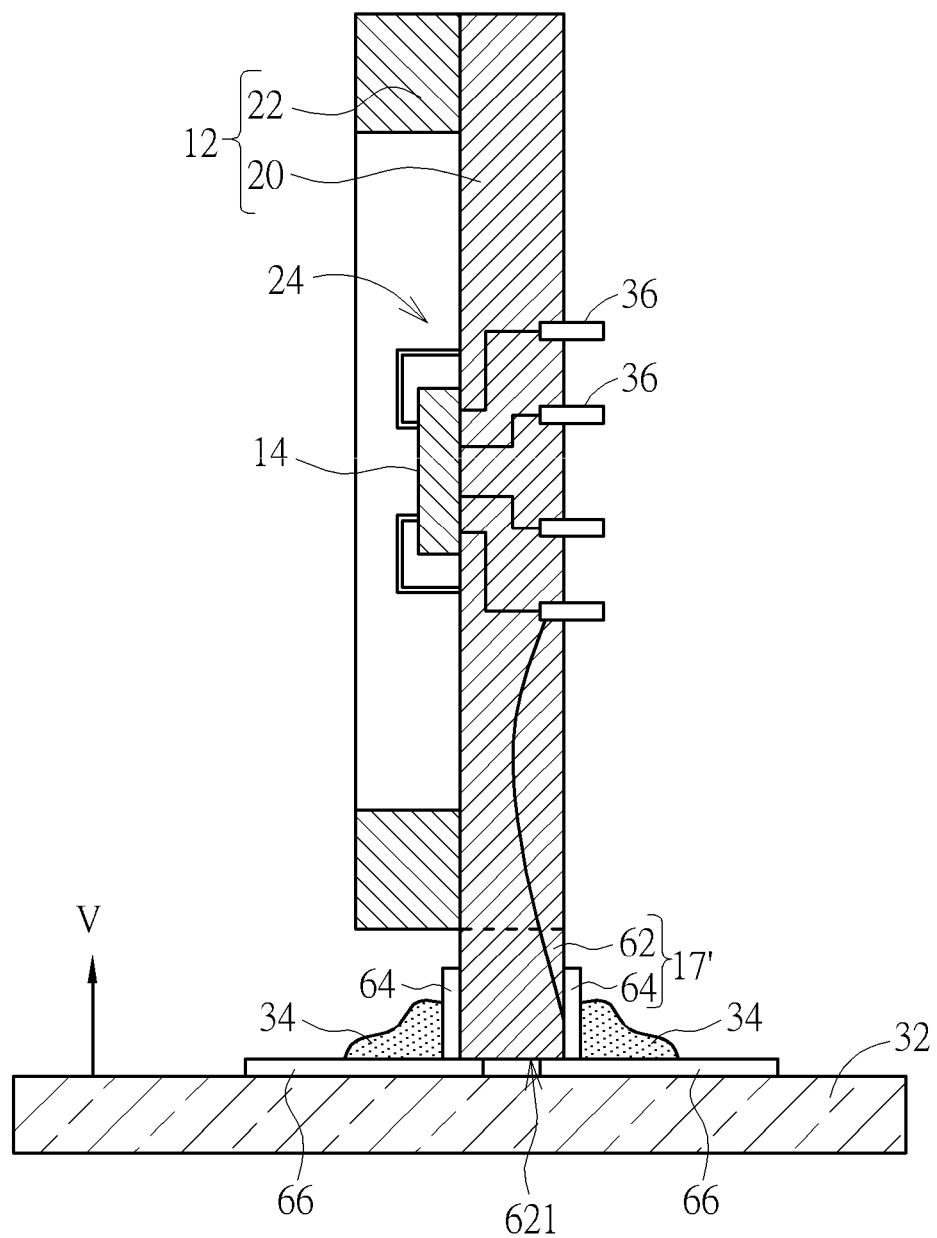
FIG. 11 is a sectional view of the optical sensing module shown in FIG. 10.
Figure 12:
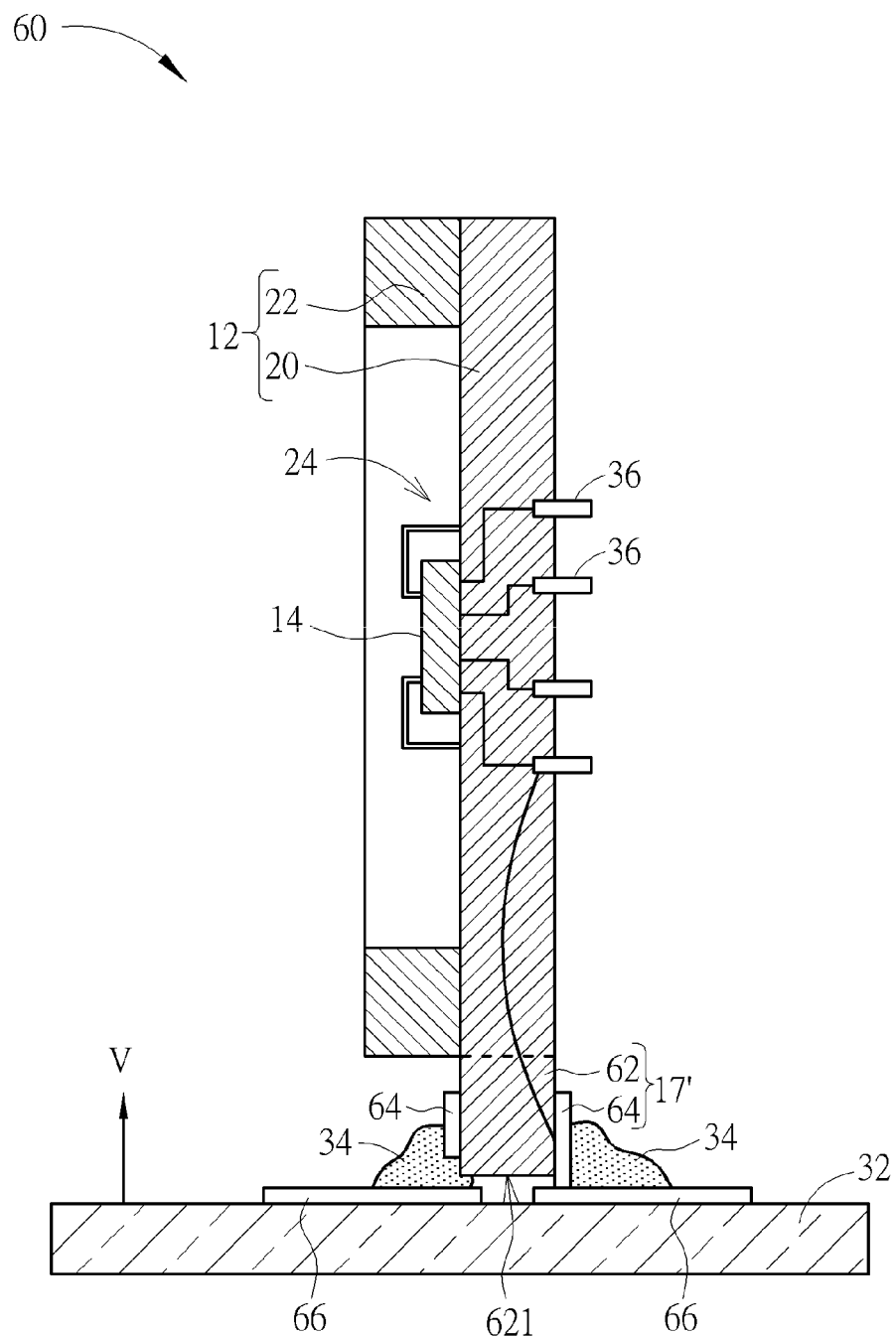
FIG. 12 is a sectional view of the optical sensing module shown in FIG. 10 in another application.

Please refer to FIG. 10 to FIG. 12. FIG. 10 is a diagram of the optical sensing module 60 according to the fourth embodiment of the present invention. FIG. 11 is a sectional view of the optical sensing module 60 shown in FIG. 10 along line D-D. FIG. 12 is a sectional view of the optical sensing module 60 shown in FIG. 10 in another application. The optical sensing module 60 includes the supporter 12, the photosensitive component 14 and the connecting component 17'. The photosensitive component 14 is disposed inside the accommodating space 24 formed by the bottom portion 20 and the lateral portions 22 of the supporter 12. The connecting component 17' is disposed by the supporter 12. The connecting component 17' includes a stretching portion 62 and a conductive unit 64. The stretching portion 62 is connected to at least one lateral side of the bottom portion 20. The conductive unit 64 is disposed on a surface of the stretching portion 62. Relative position between the stretching portion 62 and the conductive unit 64 may be varied according to different manufacturing method, however the supporter 12 still can stand upon the circuit board 32 via the connecting component 17' and the opening 26 faces toward any direction different from the planar normal vector V of the circuit board 32. For example, the conductive unit 64 can align with an outer edge 621 of the stretching portion 62 opposite to the bottom portion 20, as shown in FIG. 11. Besides, the conductive unit 64 may partly protrude from the outer edge 621 of the stretching portion 62 or may be receded from the outer edge 621 of the stretching portion 62, as shown in FIG. 12.

In the fourth embodiment, the thickness T3 of the bottom portion 20 is preferably larger than 0.8 times the thickness T4 of the lateral portion 22, and the thickness T3 of the bottom portion 20 is preferably larger than 0.4 millimeter, to ensure that the supporter 12 can stably stand upon the circuit board 32 by the bottom portion 20 and the stretching portion 62. A total length L1 of the bottom portion 20 and the stretching portion 62 is preferably smaller than 10 times a sum of the thickness T3 and the thickness T4, to avoid the supporter 12 from falling. An amount of the conductive unit 64 is designed according to actual demand of the optical sensing module 60. The plurality of conductive units 64 can be respectively disposed on opposite surfaces of the stretching portion 62, or can be disposed on different position on the same surface of the stretching portion 62. In addition, a length of the conductive unit 64 is preferably ranged between 0.2 millimeter and 2 millimeter, a width of the conductive unit 64 is preferably ranged between 0.2 millimeter and 3 millimeter, and an edge interval between two adjacent conductive units 64 is preferably larger than 0.2 millimeter. At least one of the plurality of conductive units 64 can be electrically connected to the connecting terminal 36 protruding from the bottom portion 20, optionally.

As shown in FIG. 11 and FIG. 12, the circuit board 32 may have one or more conductive object 66. A range whereinside the conductive objects 66 are located is adapted to define the specific region. The supporter 12 utilizes the bridging medium 34 to connect the conductive unit 64 on the stretching portion 62 with the specific region formed by the conductive object 66. It is to say, the specific region can be represented as a connector of the circuit board 32, the conductive object 66 can be represented as a terminal inside the connector. In the embodiment that the conductive unit 64 aligns with the outer edge 621 of the stretching portion 62, the conductive unit 64 directly contacts the conductive object 66, and the bridging medium 34 is spread between the conductive unit 64 and the conductive object 66 for conjunction by the surface tension of the solder paste (such like the bridging medium 34). In the embodiment that the conductive unit 64 partly protrudes from the outer edge 621 or is receded from the outer edge 621, the protruding conductive unit 64 directly contacts the conductive object 66, the receded conductive unit 64 electrically contacts the conductive object 66 via the bridging medium 34, so as to provide aims of preferred connection strength and stability.

Figure 13:
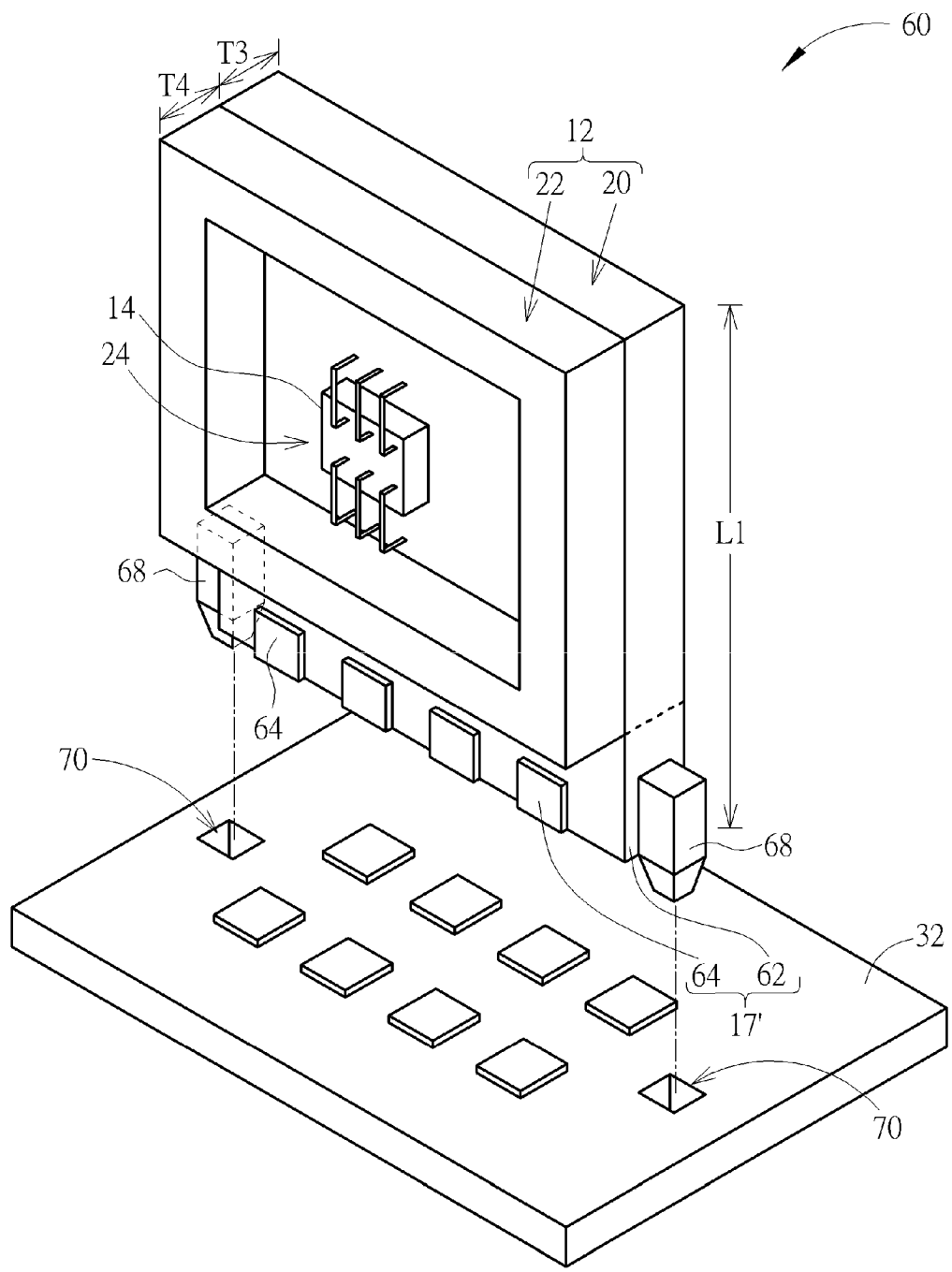
FIG. 13 is a diagram of the optical sensing module according to another possible embodiment of the present invention.
Figure 14:
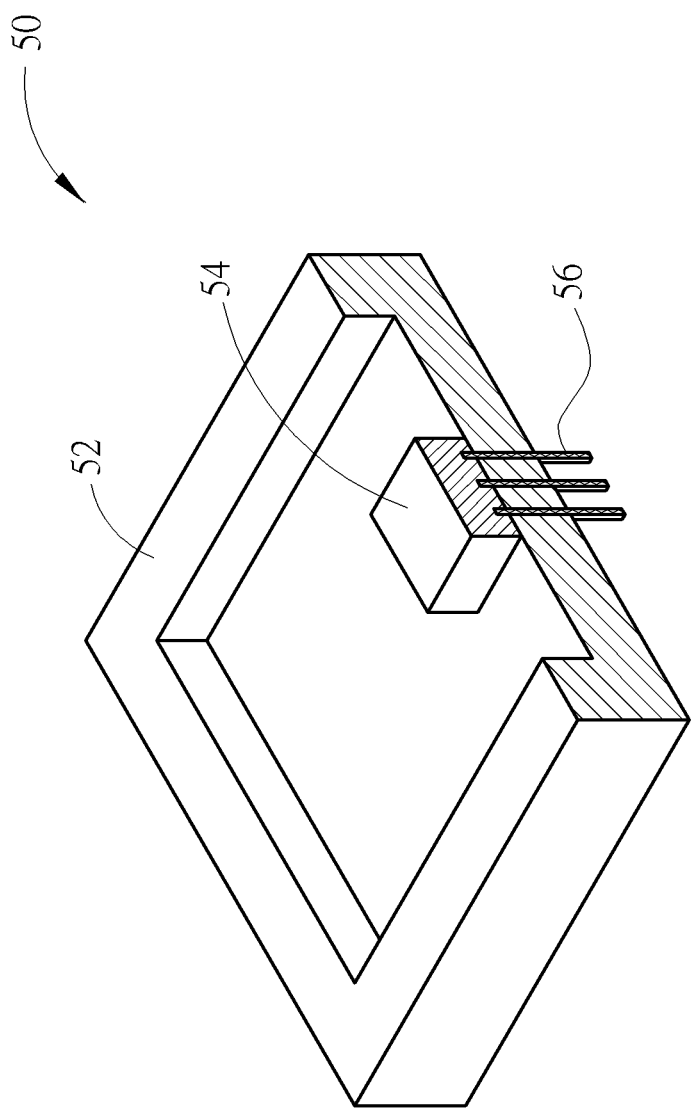
FIG. 14 is a sectional view of a detecting module in the prior art.

Please refer to FIG. 13. FIG. 13 is a diagram of the optical sensing module according to another possible embodiment of the present invention. As an example of the optical sensing module 60, the positioning components 68 are optionally disposed by the supporter 12, and the positioning components 68 are preferably disposed by the lateral side of the bottom portion 20. The bottom end (the end facing the circuit board 32) of the positioning component 68 protrudes from an edge of the bottom portion 20, and the positioning hole structure 70 is formed on the circuit board 32 accordingly. While the optical sensing module 60 is assembled with the circuit board 32 via the connecting component 17', the positioning component 68 partly inserts into the positioning hole structure 70, and the positioning component 68 can be fixed inside the positioning hole structure 70 in a wedged manner or in an adhesive manner optionally. According to auxiliary of the positioning component 68 and the positioning hole structure 70, the optical sensing module 60 can vertically stand upon the circuit board 32 to prevent the supporter 12 from being inclined or rotatably deviated due to the non-uniform tension generated by the melted bridging medium 34. A protruding part of the bottom end of the positioning component 68 can be preferably formed as an inclined guiding structure, which is adapt to smoothly insert into the positioning hole structure 70.

In conclusion, one of the embodiments in the present invention forms the hole structure on the lateral portion of the supporter, and the conductive unit is disposed inside the hole structure to connect with the circuit board via the bridging medium; wherein an active circuit or a passive circuit is optionally disposed inside the circuit board in accordance with design demand of the optical sensing module. An amount of the hole structure can be one or more, a variety of the hole structure can be, but not limited to, the half-hole structure or the quarter-hole structure, and position of the foresaid hole structures is not limited the above-mentioned embodiments in the present invention. The foresaid lateral portion can only be the lateral surface of the base, or be the lateral surface of the sheltering component, or be the whole or partial lateral surfaces of the base and the sheltering component. The hole structure may be formed on the all lateral portions of the supporter, or optionally formed on the part of the lateral portions of the supporter.

The other embodiment in the present invention disposes the stretching portion by the supporter, the stretching portion has the conductive unit, and the conductive unit can be connected with the circuit board via the bridging medium; in this embodiment, the active circuit or the passive circuit can be optionally disposed inside the circuit board. While the supporter utilizes the hole structure or the stretching portion of the connecting component to stand upon the circuit board, the supporter fixed onto the circuit board can face any sensing direction, which means signal transmission direction of the optical sensing module can be varied according to user's demand. Comparing to the prior art, the present invention disposes the connecting component having the hole structure or the stretching portion by the supporter, the supporter can be disposed on the circuit board alternatively by the bottom portion and the lateral portion, and the optical sensing module can provide the multi-directional optical sensing function.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical sensing module with a multi-directional optical sensing function, capable of being fixed to a circuit board via a bridging medium, the optical sensing module comprising:
    a supporter having a bottom portion and a plurality of lateral portions, the plurality of lateral portions being bent from edges of the bottom portion, and an accommodating space being formed between the plurality of lateral portions;
    a photosensitive component disposed inside the accommodating space and adapted to receive an optical signal passing through an opening of the accommodating space; and
    a connecting component disposed on a lateral surface of the bottom portion adjacent to the plurality of lateral portions, the connecting component comprising a conductive unit, the supporter being connected with the bridging medium via the conductive unit so as to connect the circuit board at one of a plurality of sensing directions.

2. The optical sensing module of claim 1, wherein the connecting component further comprises at least one hole structure formed on at least one corresponding lateral portion of the plurality of lateral portions, and the conductive unit is disposed inside the hole structure.

3. The optical sensing module of claim 1, wherein the connecting component further comprises a stretching portion connected to a lateral side of the bottom portion, and the conductive unit is disposed on a surface of the stretching portion.

4. The optical sensing module of claim 1, wherein the supporter stands on the circuit board by the corresponding lateral portion, and the opening faces toward a direction different from a planar normal vector of the circuit board.

5. The optical sensing module of claim 1, wherein the supporter further comprises at least one connecting terminal electrically connected to the photosensitive component and protruding from the bottom portion, the connecting terminal is further electrically connected to the conductive unit.

6. The optical sensing module of claim 1, wherein the conductive unit is electrically connected to the photosensitive component, and further electrically connected to an external electronic component via a connecting cable.

7. The optical sensing module of claim 2, wherein the supporter comprises a base and a sheltering component, the photosensitive component is disposed on the base, and the sheltering component is disposed around the photosensitive component to form the accommodating space.

8. The optical sensing module of claim 7, wherein a thickness of the base is larger than 0.8 times a thickness of the sheltering component, and a width of the base is smaller than 8 times a total thickness of the base and the sheltering component.

9. The optical sensing module of claim 7, wherein the lateral portion is a lateral surface of the base, or is an assembly of the lateral surface of the base and a corresponding lateral surface of the sheltering component, or is an assembly of the lateral surface of the base and a part of the corresponding lateral surface of the sheltering component.

10. The optical sensing module of claim 9, wherein a radial dimension of the hole structure located within the base is the same as or different from a radial dimension of the hole structure located within the sheltering component.

11. The optical sensing module of claim 9, wherein the hole structure breaks through two opposite sides of the sheltering component while the hole structure is formed on the corresponding lateral surface of the sheltering component.

12. The optical sensing module of claim 9, wherein while the hole structure is formed on the part of the corresponding lateral surface of the sheltering component, the hole structure is located on a side of the sheltering component adjacent to the base and does not protrude from the other side of the sheltering component opposite to the base.

13. The optical sensing module of claim 3, wherein a thickness of the bottom portion is larger than 0.8 times a thickness of the lateral portion, and the thickness of the bottom portion is larger than 0.4 millimeter.

14. The optical sensing module of claim 3, wherein a total length of the bottom portion and the stretching portion is smaller than 10 times a total thickness of the bottom portion and the lateral portion.

15. The optical sensing module of claim 3, wherein a length of the conductive unit is ranged between 0.2 millimeter and 2 millimeter, and a width of the conductive unit is ranged between 0.2 millimeter and 3 millimeter.

16. The optical sensing module of claim 3, wherein the conductive unit aligns with an outer edge of the stretching portion opposite to the bottom portion, or partly protrudes from the outer edge of the stretching portion, or is receded from the outer edge of the stretching portion.

17. The optical sensing module of claim 3, wherein the optical sensing module further comprises a plurality of conductive units respectively disposed on different surfaces or the same surface of the stretching portion, an edge interval between two adjacent conductive units of the plurality of conductive units is larger than 0.2 millimeter.

18. The optical sensing module of claim 3, wherein the stretching portion is connected to a specific region on the circuit board.

19. The optical sensing module of claim 18, wherein the circuit board comprises at least one conductive object adapted to define the specific region, and the conductive unit is connected to the conductive object via the bridging medium.

20. The optical sensing module of claim 1, wherein at least one of an active circuit and a passive circuit is disposed inside the bottom portion.

21. The optical sensing module of claim 1, wherein a positioning hole structure is formed on the circuit board, the optical sensing module further comprises a positioning component disposed by the supporter and adapted to partly insert into the positioning hole structure.

* * * * *